United States Patent
Okubo et al.

[11] Patent Number: 5,495,444
[45] Date of Patent: Feb. 27, 1996

[54] SEMICONDUCTOR MEMORY DEVICE USED AS A DIGITAL BUFFER AND READING AND WRITING METHOD THEREOF

[75] Inventors: Hiizu Okubo, Nishinomiya; Hideyuki Aota, Himeji, both of Japan

[73] Assignee: Ricoh Company, Ltd., Tokyo, Japan

[21] Appl. No.: 275,233

[22] Filed: Jul. 14, 1994

[30] Foreign Application Priority Data

Jul. 14, 1993 [JP] Japan .................. 5-174177

[51] Int. Cl.$^6$ .................................................. G11C 7/00
[52] U.S. Cl. .................. 365/189.04; 365/189.01; 365/230.03; 365/230.05
[58] Field of Search .................. 365/189.04, 189.03, 365/230.03, 230.05, 189.01

[56] References Cited

U.S. PATENT DOCUMENTS

| | | | |
|---|---|---|---|
| 4,847,809 | 7/1989 | Suzuki | 365/189.04 |
| 4,979,147 | 12/1990 | Ushiki | 365/189.04 |
| 4,987,559 | 1/1991 | Miyauchi et al. | 365/230.05 |
| 5,029,135 | 7/1991 | Okubo et al. | 356/203 |
| 5,177,706 | 1/1993 | Shinohara et al. | 365/189.04 |
| 5,291,453 | 3/1994 | Aota et al. | 365/221 |
| 5,309,395 | 5/1994 | Dickinson et al. | 365/189.04 |
| 5,388,073 | 2/1995 | Usami et al. | 365/189.04 |

FOREIGN PATENT DOCUMENTS

| | | | |
|---|---|---|---|
| 62-33391 | 2/1987 | Japan | 365/189.04 |
| 1112592 | 5/1989 | Japan | 365/189.04 |
| 9107754 | 5/1991 | WIPO | 365/189.04 |

Primary Examiner—Tan T. Nguyen
Attorney, Agent, or Firm—Cooper & Dunham

[57] ABSTRACT

A semiconductor memory device having a small chip area is provided to reduce a manufacturing cost. The semiconductor memory device has memory unit comprising memory cells arranged in a matrix comprising n rows and m columns, where $m \geq 2$ and $n \geq 1$, each of the memory cells having a single port and being capable of storing a single word of data comprising at least one bit, the memory cells arranged in a single column forming a memory cell block. The semiconductor memory device selects one set of two memory cells, one from an arbitrary memory cell block and the other from a different memory cell block. A reading operation performed and a writing operation for the set of two memory cells are performed during the same cycle. Another set of two memory cells are selected by a selecting unit, when the reading operation and the writing operation for one cycle are completed, for performing another cycle of the reading operation and the writing operation, the reading operation and the writing operation being repeated for a predetermined number of cycles.

22 Claims, 12 Drawing Sheets

SEMICONDUCTOR MEMORY DEVICE USED AS A DIGITAL BUFFER AND READING AND WRITING METHOD THEREOF

BACKGROUND OF THE INVENTION

The present invention generally relates to a semiconductor memory devices, and more particularly to a semiconductor memory device used as a digital buffer performing a delay of digital data and to a reading and writing method for the semiconductor memory device.

In an image data processing apparatus, such as a facsimile machine and a digital copy machine, which handles digital image data, a line buffer memory is used for storing the image data. The purpose of using the line buffer memory is to perform an image processing such as enhancing of an edge of an image. Such an enhancement is performed by comparing image data corresponding to a particular line with image data corresponding to other lines including one or two lines prior to the particular line or one or two lines after the particular line.

As long as the line buffer memory is used for the above-mentioned application, the line buffer memory may have only a function to read from and write to the same address. However, a conventional line buffer memory such as show in FIG. 1 has a function to read from and write to different addresses. Accordingly, the conventional line buffer memory comprising a semiconductor memory device is provided with two ports, one for reading and one for writing.

FIG. 2 shows a circuit diagram of a memory cell having a read port and a write port, the memory cell being provided in the conventional line buffer memory shown in FIG. 1. In FIG. 2, transistors enclosed by circles are provided for constructing a two-port type memory cell of a semiconductor memory device in addition to transistors necessary for constructing a single-port type memory cell. Due to these additional transistors, the conventional line buffer memory has an area size one and a half to three times larger than that of the semiconductor memory-device having a single port. Therefore, the conventional line buffer memory has a higher manufacturing cost than the semiconductor memory device having a single port.

SUMMARY OF THE INVENTION

It is a general object of the present invention to provide an improved and useful semiconductor memory device and reading and writing method in which the above-mentioned problem is eliminated.

A more specific object of the present invention is to provide a semiconductor memory device having a small chip area to reduce a manufacturing cost.

Another object of the present invention is to provide a reading and writing method of data for the semiconductor memory device by which a size of the semiconductor memory device can be miniaturized.

According to one aspect of the present invention, there is provided a semiconductor memory device having memory unit comprising memory cells arranged in a matrix comprising n rows and m columns, where $m \geq 2$ and $n \geq 1$, each of the memory cells having a single port and being capable of storing a single word data comprising at least one bit, the memory cells arranged in a single column forming a memory cell block, the semiconductor memory device comprising:

a selecting means for selecting one set of two memory cells, one from an arbitrary memory cell block and the other from a different memory block;

reading means for reading the single word of data stored in one of the two memory cells, the single word data of each of the memory cells being read out cycle by cycle;

writing means for writing the single word data in the other of the memory cells during a single cycle; and wherein a reading operation performed by the reading means and a writing operation performed by the writing means for the set of two memory cells are performed during the same cycle, another set of two memory cells being selected by the selecting means, when the reading operation and the writing operation for one cycle are completed, for performing another cycle of the reading operation and the writing operation, the reading operation and the writing operation being repeated for a predetermined number of cycles.

Additionally, there is provided, according to another aspect of the present invention, a semiconductor memory device having memory means comprising memory cells arranged in a matrix comprising n rows and m columns, where $m \geq 2$ and $n \geq 1$, each of the memory cells having a single port and being capable of storing a single word of data comprising at least one bit, the memory cells arranged in a single column forming a memory cell block, the semiconductor memory device comprising:

selecting means for selecting one set of two cells having consecutive matrix coordinate values $(s, t)$ and $(s, t+1)$, respectively, where $1 \geq s \geq n$ and $1 \geq t \geq m$, and wherein $s+1=1$ when $s=n$, $s-1=n$ when $s=1$, $t+1=1$ when $t=m$, and $t-1=m$ when $t=1$, one of the two memory cells having a greater matrix coordinate value being a memory cell to be read;

reading means for reading the single word data stored in one of the two memory cells, the single word data of each of the memory cells being read out cycle by cycle;

writing means for writing the single word data in the other of the memory cells during a single cycle; and wherein a reading operation performed by the reading means and a writing operation performed by the writing means for the set of two memory cells are performed during the same cycle, another set of two memory cells having matrix coordinate values $(s, t+1)$ and $(s, t+2)$ being selected by the selecting means, when the reading operation and the writing operation for one cycle are completed, for performing another cycle of the reading operation and the writing operation, wherein s is incremented when t reaches m, the reading operation and the writing operation being repeated for a predetermined number of cycles by incrementing the matrix coordinate values of the two memory cells to be selected.

Additionally, there is provided, according to another aspect of the present invention, a data writing and reading method for a semiconductor memory device having memory means comprising memory cells arranged in a matrix comprising n rows and m columns, where $m \geq 2$ and $n \geq 1$, each of the memory cells having a single port and being capable of storing a single word of data comprising at least one bit, the data writing and reading method comprising the steps of:

a) selecting two consecutive memory cells having matrix coordinate values (s, t) and (s+1, t+1) in the matrix, where 1≧s≧n and 1≧t≧m, and wherein s+1=1 when s=n, s−1=n when s=1, t+1=1 when t=m, and t−1=m when t=1, b) reading the single word data stored in one of the two memory cells, the single word data of each of the memory cells being read out cycle by cycle;

c) writing the single word data in the other of the memory cells during a single cycle, a reading operation performed in the step b) and a writing operation in the step c) are performed during the same cycle;

d) selecting another set of two memory cells having matrix coordinate values (s, t+1) and (s, t+2), when the reading operation and the writing operation for one cycle are completed, for performing another cycle of the reading operation and the writing operation, wherein s is incremented when t reaches m, e) repeating the steps b) to d) for a predetermined number of cycles by incrementing the matrix coordinate values of the two memory cells to be selected.

According to the present invention, each of the memory cells provided in the semiconductor memory device can be a single port type because the memory cell to be read and the memory cell to be written are selected from different memory cell blocks which condition allows the reading operation and the writing operation be performed at the same time but for the memory cells provided in different memory cell blocks. Thus the semiconductor memory device can be miniaturized with a reduced manufacturing cost.

Other objects, features and advantages of the present invention will become more apparent from the following detailed descriptions when read in conjunction with the accompanying drawings.

DETAILED DESCRIPTION OF THE PREFERRED EMBODIMENTS

Figure 1:
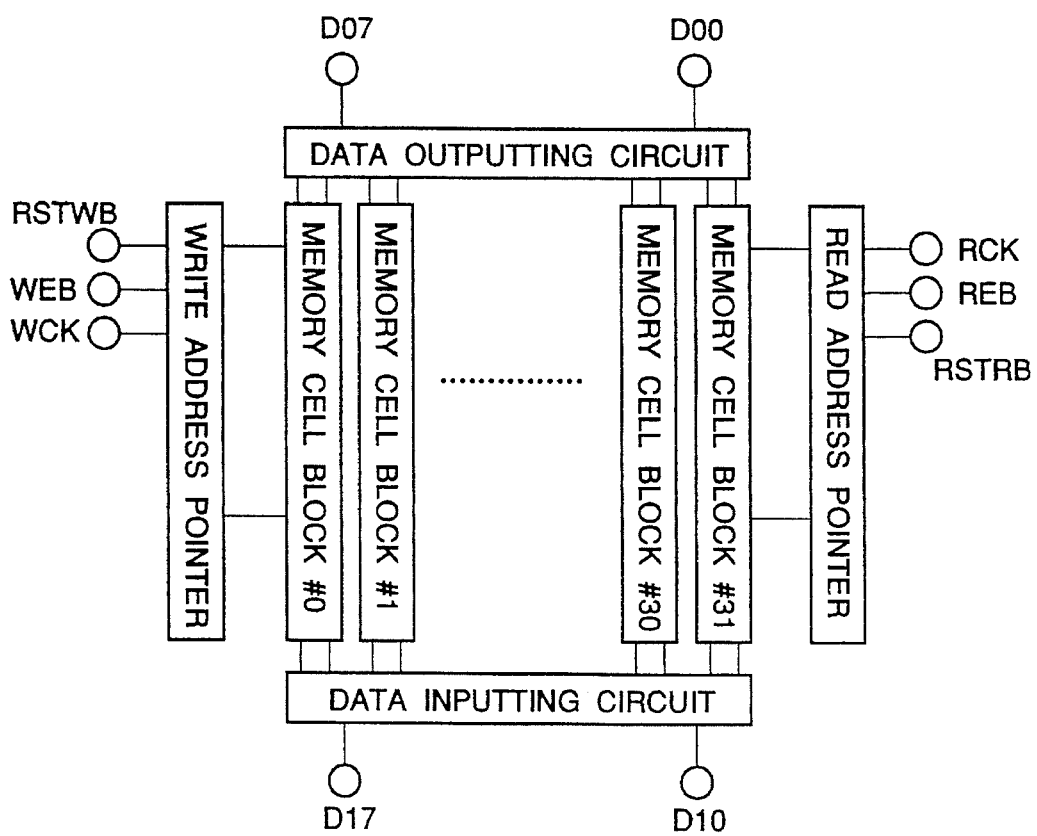
FIG. 1 is an illustration showing a construction of a conventional semiconductor memory device used for a line buffer memory.
Figure 2:
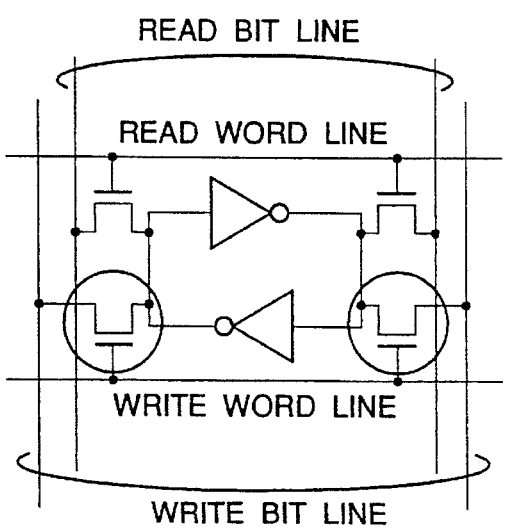
FIG. 2 is a circuit diagram of a part of the semiconductor memory device shown in FIG. 1 in which two-port type memory cells are used.
Figure 3:
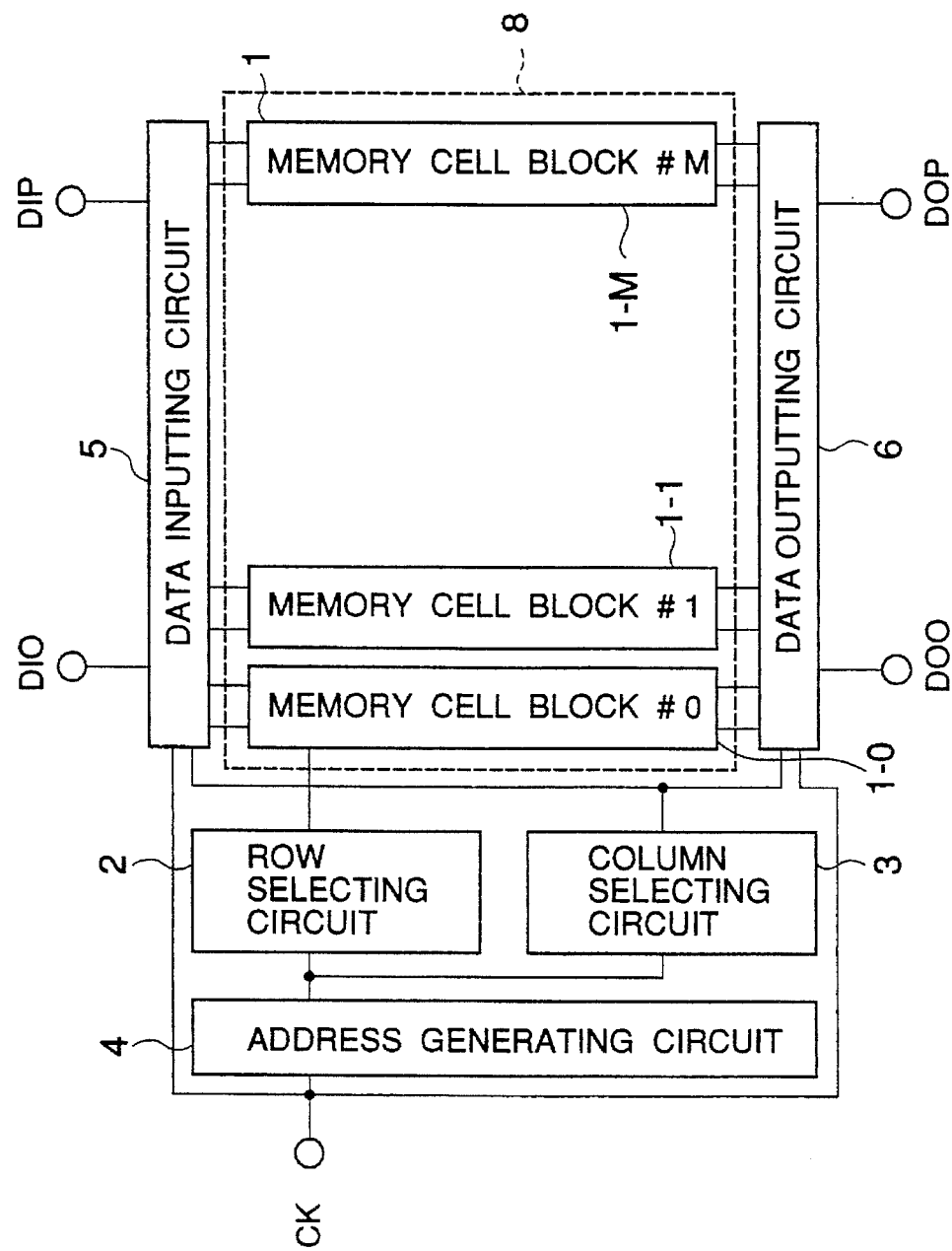
FIG. 3 is a block diagram of a first embodiment of a semiconductor memory device according to the present invention.

A description will now be given of a first embodiment of a semiconductor memory device according to the present invention. FIG. 3 is a block diagram of the first embodiment of a semiconductor memory device according to the present invention.

Figure 11:
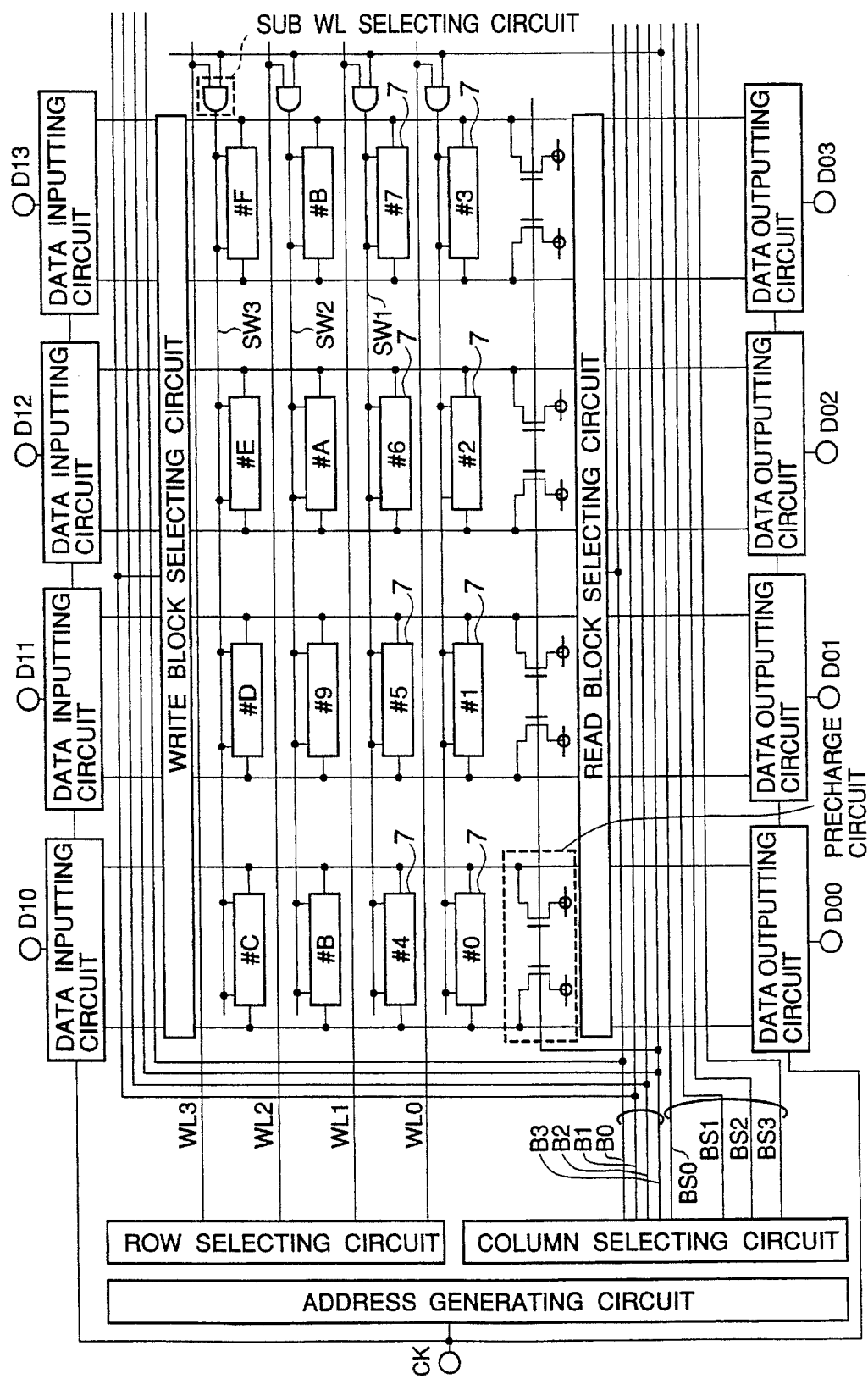
FIG. 11 is a block diagram of a semiconductor memory device according to the present invention in which semiconductor memory device each memory cell comprises a plurality of bits.

In FIG. 3, memory means 8 comprises m (m≧2) memory cell blocks 1-0 to 1-M, each memory cell block comprising n (n≧1) memory cells. Each of (n×m) memory cells has p (p≧1) basic cells each of which are single-port type and stores a single bit, so as to store one word data. In an embodiment shown in FIG. 11, the above number p is "4" and the number n is also "4". That is, the memory cell block shown in FIG. 11 is capable of storing 4 word data each comprising 4 bits. The memory means 8 has m memory cell blocks having the above-mentioned structure. The basic cells may be either SRAMs or DRAMs.

It should be noted that the above-mentioned memory cell blocks 1-0 to 1-M may be hereinafter referred to as memory cell blocks 1 as a whole.

A description will now be given, with reference to FIG. 4, of a first embodiment of a semiconductor memory device according to the present invention. The semiconductor memory device shown in FIG. 4 comprises a row selecting circuit 2, a column selecting circuit 3, an address generating circuit 4, a data inputting circuit 5 and a data outputting circuit 6. The row selecting circuit 2 selects one row from among n rows formed by the memory cell blocks 1. The column selecting circuit 3 selects one of memory cell blocks 1. The address generating circuit 4 generates address data in accordance with a synchronous signal supplied by an external device. Upper address data is provided to the row selecting circuit 2, and lower address data is supplied to the column selecting circuit 3. The data inputting circuit 5 inputs write data supplied by an external device to the selected one of memory cell blocks 1. The data outputting circuit 6 outputs data read out from the memory cell to an external device. The data inputting circuit 5 and the data outputting circuit 6 perform inputting and outputting of data for the same address during a single cycle in accordance with the synchronous signal.

A description will now be given, with reference to FIG. 4, of a detail of the semiconductor memory device of the present embodiment. In FIG. 4, parts that are the same as the parts shown in FIGS. 3 and 11 are given the same reference numerals, and descriptions thereof will be omitted.

Figure 4:
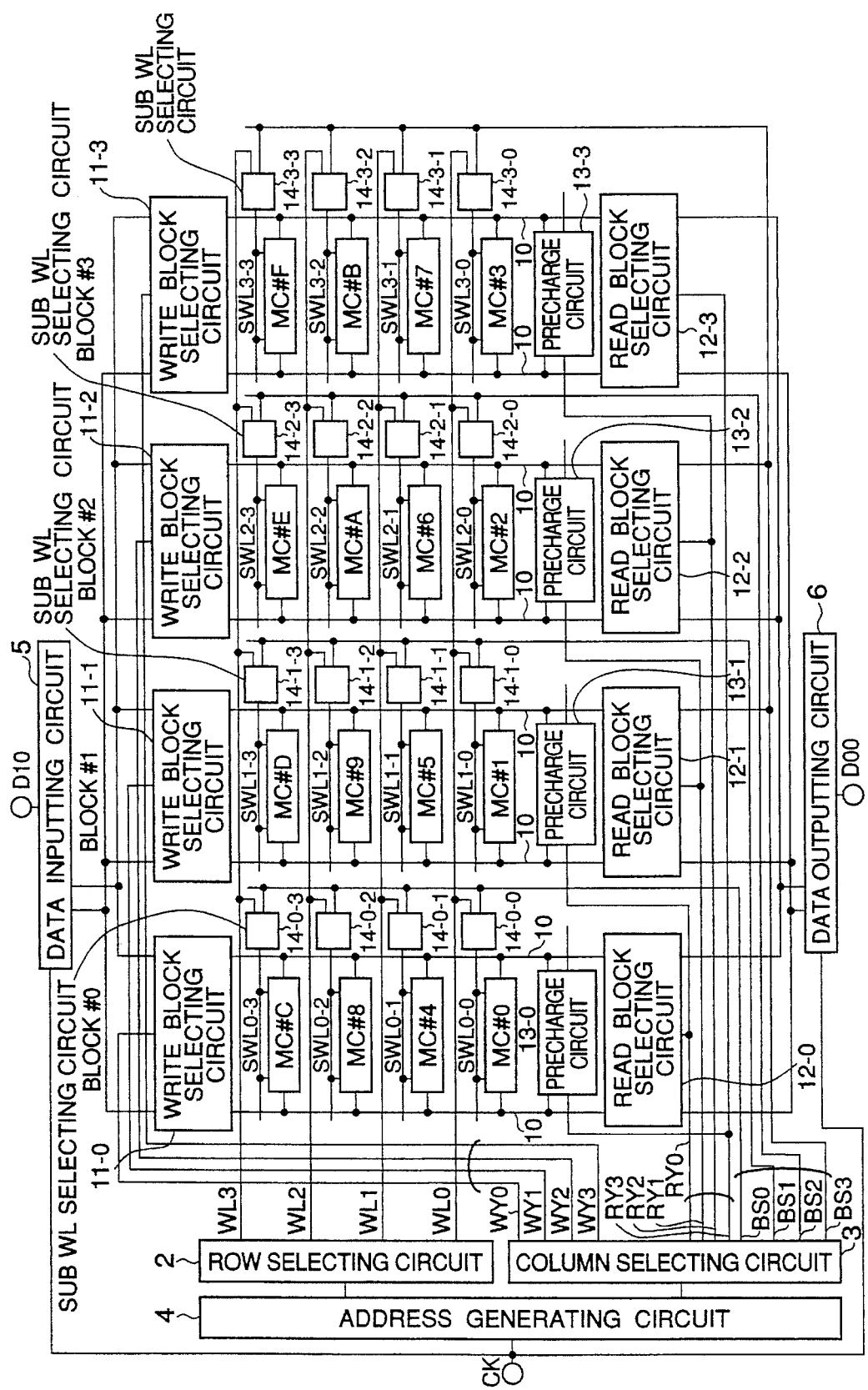
FIG. 4 is a block diagram of a first embodiment of a semiconductor memory device according to the present invention.

FIG. 4 shows a semiconductor memory device having sixteen memory cells MC#1 to MC#F divided into four memory cell blocks 1-0 (indicated by #1 in the figure) to 1-3 (#3 in the figure). Each of the memory cells MC#1 to MC#F has a basic cell storing 1-bit data (hereinafter called D0 bit data). The memory cell block #0 is formed, for example, by the memory cells MC#0, MC#4, MC#8 and MC#C arranged in a column. Since each of the memory cells store 1-bit data, the data inputting circuit 5 and the data outputting circuit 6 inputs and outputs 1-bit data to each of the memory cell blocks 1. Accordingly, the semiconductor memory device of the present embodiment has only a single data-inputting circuit and a single data-outputting circuit unlike the semiconductor memory device shown in FIG. 11 described later.

In the above-mentioned semiconductor memory device, the row starting from the memory cell MC#0 is referred to as row 1. The row starting from the memory cell MC#4 is referred to as row 2. The row starting from the memory cell MC#8 is referred to as row 3. The row starting from the memory cell MC#C is referred to as row 4. The column starting from the memory cell MC#0 is referred to as column 1. The column starting from the memory cell MC#1 is referred to as column 2. The column starting from the memory cell MC#2 is referred to as column 3. The column starting from the memory cell MC#3 is referred to as column 4. That is, for example, the coordinate position of the memory cell MC#0 is referred to as (row 1×column 1); the coordinate position of the memory cell MC#1 is referred to as (row 1×column 2); the coordinate position of the memory cell MC#3 is referred to as (row 1×column 2); the coordinate position of the memory cell MC#4 is referred to as (row 2×column 1); the coordinate position of the memory cell MC#F is referred to as (row 4×column 4).

Each of the memory cells MC#1 to MC#F is connected to a pair of bit lines 10 provided to each of the memory cell blocks 1. The pair of bit lines 10 are connected to the respective write block selecting circuits 11-0 to 11-3 and read block selecting circuits 12-0 to 12-3. Each of the write block selecting circuits 11-0 to 11-3 is connected to the data inputting circuit 5 to which the D0 bit data is supplied. Each of the read block selecting circuits 12-0 to 12-3 is connected to the data outputting circuit 6 from which the D0 bit data is output. The write block selecting circuit 5 and the read block selecting circuit 6 are connected to the column selecting circuit 3 described in detail later.

One of the write block selecting circuits 11-0 to 11-3 are selected by a write block selection signal supplied by the column selecting circuit 3. The D0 bit data supplied by the data inputting circuit 5 is sent to one of the memory cells via the bit lines 10 of the column corresponding to the selected write block selecting circuit. One of the read block selecting circuits 12-0 to 12-3 are selected by a read block selection signal supplied by the column selecting circuit 3. The D0 bit data read out from one of the memory cells is sent to the data outputting circuit 6 via the bit lines 10 of the column corresponding to the selected write block selecting circuit.

Precharging circuits 13-0 to 13-3 are connected to the respective bit lines of each of the memory cell blocks 1. An operation of the precharging circuits 13-0 to 13-3 is started when the corresponding read block selection signal is supplied. In the present embodiment, the read block selection signal to be supplied to the read block selecting circuit 12-0 corresponding to the memory cell block #0 is also supplied to the read block selecting circuit 12-1 corresponding to the memory cell block #0. The read block selection signal to be supplied to the read block selecting circuit 12-1 corresponding to the memory cell block #1 is also supplied to the read block selecting circuit 12-2 corresponding to the memory cell block #1. The read block selection signal to be supplied to the read block selecting circuit 12-2 corresponding to the memory cell block #2 is also supplied to the read block selecting circuit 12-3 corresponding to the memory cell block #3. The read block selection signal to be supplied to the read block selecting circuit 12-3 corresponding to the memory cell block #3 is also supplied to the read block selecting circuit 12-0 corresponding to the memory cell block #0.

Additionally, word lines WL0 to WL3 are provided to a respective row of the memory cells. Each of the word lines WL0 to WL3 is connected to an input terminal of one of sub WL selecting circuits 14-0-0 to 14-3-3 each provided to the respective one of the memory cells MC#1 to MC#F. Additionally, an input terminal of each of the sub WL selecting circuits 14-0-0 to 14-3-3 is connected to the column selecting circuit 3 via the respective one of block selection signal lines BS0 to BS3. An output terminal of each of the sub WL selecting circuits 14-0-0 to 14-3-3 is connected to the respective sub word lines SWL0-0 to SWL3-3 each connected to the respective one of memory cells MC#0 to MC#F.

It should be noted that when each of the memory cells stores a plurality of bits, for example, when each of the memory cells stores 4 bits as shown in FIG. 11, four basic cells are connected to each of the sub word lines SWL0-3 to SWL3-3.

In the above-mentioned structure, for example, if a row selection signal is supplied by the row selecting circuit 2 to the word line WL0, the row selection signal is supplied to the sub WL selecting circuits 14-0-0 to 14-0-3 corresponding to the row starting from the memory cell MC#0. At the same time, if the block selection signal is supplied by the column selecting circuit 3 to the block selection signal line BS0 provided to the memory cell block #0 corresponding to the column starting from the memory cell MC#0, only the sub WL selecting circuit 14-0-0 positioned at the intersection of the word line WL0 and the block selection signal line BS0 is activated. Accordingly, a reading or writing operation to the memory cell MC#0 connected to the activated sub WL selecting circuit 14-0-0 can be performed.

A description will now be given of an operation of the present embodiment.

A description will be given of an operation performed in a state of cycle 1 shown in FIG. 5. During the cycle 1, the word line WL0 is selected by the row selecting circuit 2. The write block selection signal is supplied from the column selecting circuit 3 to the write block selecting circuit 11-0 via the write block selection signal line WY0. Additionally, the read block selection signal is supplied from the column selecting circuit 3 to the read block selecting circuit 12-1 via the read block selection signal line RY1. Further, the block selection signal is supplied from the column selecting circuit 3 to the sub WL selecting circuits 14-0-0 and 14-0-1 connected to the memory cells MC#0 and MC#1, via the block selection signal line BS0 and BS1, respectively. In the above-mentioned state, since the write block selecting circuit 11-0 and the read block selecting circuit 12-1 are in the active state, and since the word line WL0 is also in the active state, both the sub WL selecting circuit 14-0-0 and 14-0-1 are in the active state, and thus the sub word lines SWL0-0 and SWL1-0 are activated.

When the above-mentioned elements are in the active condition, the D0 bit data, which is stored data, is read out from the memory cell MC#1, and the read data is output to an external device via the data outputting circuit 6.

The read block selection signal being sent from the column selecting circuit to the read block selecting circuit 12-1 via the read block selection signal line RY1 for selecting the read block selecting circuit 12-1 is also supplied to the precharging circuit 13-2. Accordingly, the precharging circuit 13-2 is activated, and thus the bit lines 10 provided for the memory cell block #2 is precharged.

Additionally, the D0 bit data supplied from an external device via the data inputting circuit 5 is written in the memory cell MC#0 of the memory cell block #0 through the write block selecting circuit 11-0. At this time, input data DI(1') for the memory cell MC#1 is also supplied from an external device, however, the data inputting circuit 5 supplies the input data DI(1') to the memory cell MC#1 via the bit line 10 in the next cycle 2 as shown in FIG. 5.

Figure 5:
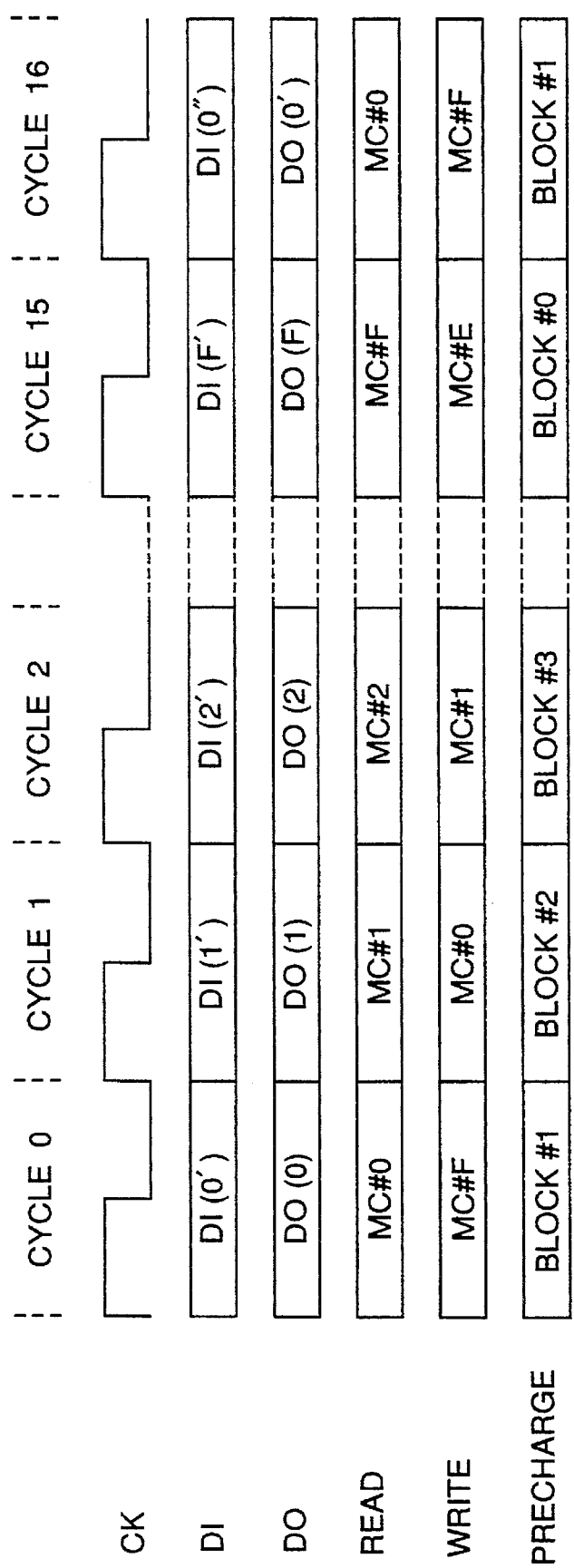
FIG. 5 is a time chart for an operation performed in the first embodiment shown in FIG. 4.

As shown in FIG. 5, in the semiconductor memory device according to the present embodiment, a data writing operation for the memory cell #(m–1) is performed during the cycle #m in which a reading operation for the memory cell #m is performed. The similar reading and writing operations are repeated until the cycle 16 is performed.

As mentioned above, in the present embodiment, the reading and writing operations for the memory cells can be performed in the same cycle, although the basic memory cell comprises a single-port type transistor. Accordingly, the semiconductor memory device according to the present embodiment can have a reduced area compared to the conventional semiconductor memory device of this kind, and thus high speed operation and low power consumption for the semiconductor memory device can be achieved.

Figure 8:
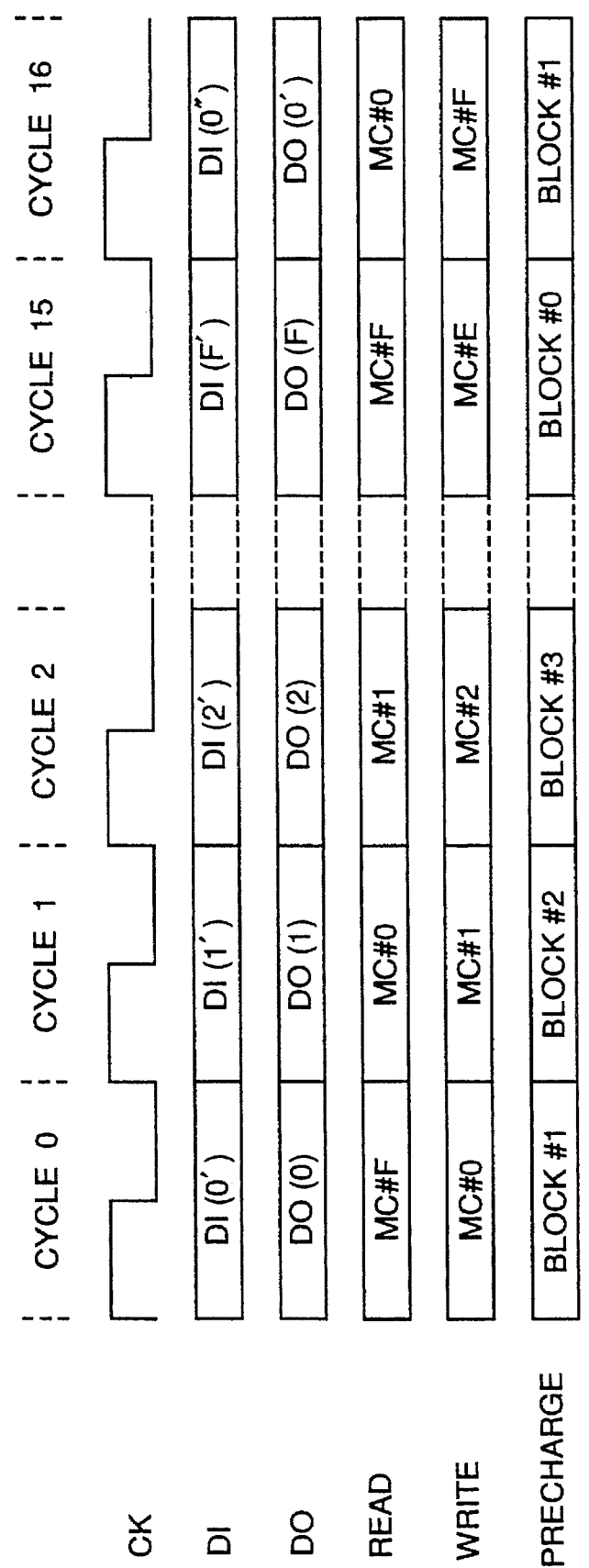
FIG. 8 is a time chart of an operation performed in a variation of the first embodiment shown in FIG. 4.

It should be noted that although the data writing operation is delayed one cycle by means of the data inputting circuit 5 in the above-mentioned embodiment, the data reading operation may instead be delayed one cycle by the data outputting circuit 6. A timing chart for this case is shown in FIG. 8.

Although, in the above-mentioned embodiment, the data reading operation and the data writing operation are performed on the two memory cells provided in adjacent memory cell blocks, two memory cells may be selected arbitrarily from two different memory cell blocks from the same row by appropriately sending the block selection signal, read block selection signal and write block selection signal.

Additionally, although the data reading and writing operations have been described, for the sake of convenience, to be performed sequentially by selecting two memory cells having consecutive matrix coordinate values by means of the row selecting circuit 2 and the column selecting circuit 3 in the present embodiment, the sequence of the operation is not limited to this order, and arbitrary memory cells may be selected from two adjacent memory cell blocks for the operation performed in the next cycle. Further, the first cycle for reading and writing operation may be started from an arbitrary two memory cells, and may be completed at an arbitrary two memory cell. The order of the selection for the two memory cells is not necessarily repeated after one selection sequence is completed.

Figure 6:
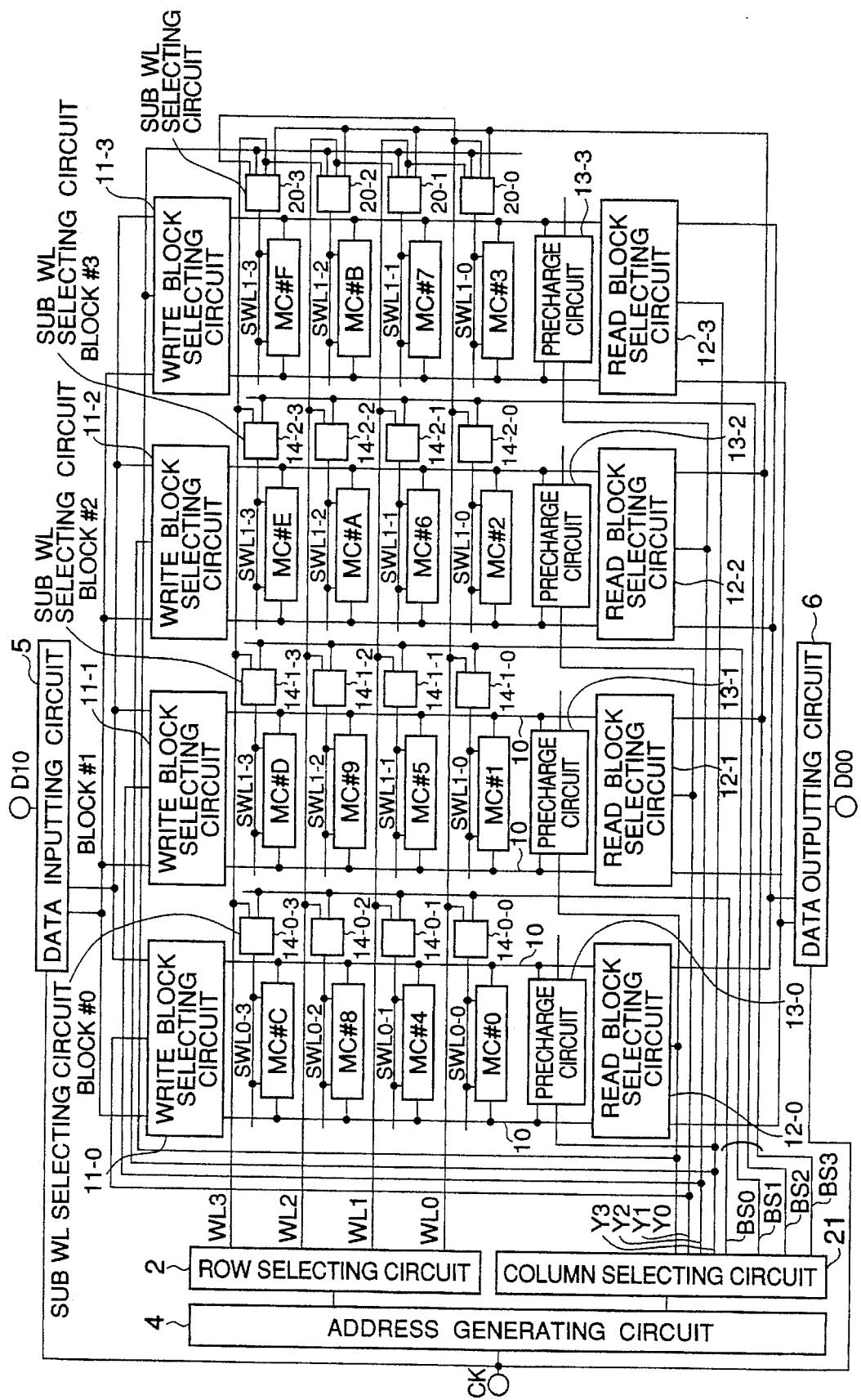
FIG. 6 is a second embodiment of a semiconductor memory device according to the present invention.

A description will now be given, with reference to FIG. 6, of a second embodiment of the present invention. In FIG. 6, parts the same as the parts shown in FIG. 4 are given the same reference numerals, and descriptions thereof will be omitted.

The second embodiment differs from the first embodiment in the connection of input terminals of sub WL selecting circuits 20-0 to 20-3 provided in the memory cell block #3, and in the connection of signal lines extending from the output of the column selecting circuit 2.

In the above description of the first embodiment, the data reading and writing operations are not limited to adjacent memory cells. On the other hand, the second embodiment and a third embodiment described later are limited to perform data reading and writing operations for consecutive memory cells in the same cycle.

A description of the second embodiment is given by focusing on the differences between the first embodiment and the second embodiment.

In FIG. 6, an output of a column selecting circuit 21 is connected with a signal line Y0 which is connected to an input of read block selecting circuit 12-0 provided in the memory cell block #0, the precharging circuit 13-1 provided in the memory cell block #1 and an input of the write block selecting circuit 11-3 provided in the memory cell #3. The output of the column selecting circuit 21 is also connected with a signal line Y1 connected to an input of the read block selecting circuit 12-1 provided in the memory cell block #1, the precharging circuit 13-2 provided in the memory cell block #2 and an input of the write block selecting circuit 11-0 provided in the memory cell #0. The output of the column selecting circuit 21 is also connected with a signal line Y2 connected to an input of the read block selecting circuit 12-2 provided in the memory cell block #2, the precharging circuit 13-3 provided in the memory cell block #3 and an input of the write block selecting circuit 11-1 provided in the memory cell #1. The output of the column selecting circuit 21 is also connected with a signal line Y3 connected to an input of the read block selecting circuit 12-3 provided in the memory cell block #3, the precharging circuit 13-0 provided in the memory cell block #0 and an input of the write block selecting circuit 11-2 provided in the memory cell #2.

A description will now be given of the connection of the sub WL selecting circuits 20-0 to 20-3. The structure of each of the sub WL selecting circuits 20-0 to 20-3 are similar to those shown in FIG. 7, That is, each of the sub WL selecting circuits 20-0 to 20-3 comprises a first AND circuit and a second circuit and an OR circuit. The first AND circuit and the second AND circuit are connected in parallel. outputs of the first AND circuit and the second AND circuit are connected to the OR circuit.

Each of the sub WL selecting circuits 20-0 to 20-3 has four input terminals corresponding to inputs of the above-mentioned first and second AND circuits. Similar to the first embodiment, one input of the second AND circuit of each of the sub WL selecting circuits 20-0 to 20-3 is connected to the block selection signal line BS3. One of the inputs of the first AND circuit is connected to the signal line Y0.

The word line WL0 is connected to the other input of the second AND circuit of the sub WL selecting circuit 20-0, and the word line WL1 is connected to the other input of the first AND circuit of the sub WL selecting circuit 20-0. The word line WL1 is connected to the other input of the second AND circuit of the sub WL selecting circuit 20-1, and the word line WL2 is connected to the other input of the first AND circuit of the sub WL selecting circuit 20-1. The word line WL2 is connected to the other input of the second AND circuit of the sub WL selecting circuit 20-2, and the word line WL3 is connected to the other input of the first AND circuit of the sub WL selecting circuit 20-2. The word line WL3 is connected to the other input of the second AND circuit of the sub WL selecting circuit 20-3, and the word line WL3 is connected to the other input of the first AND circuit of the sub WL selecting circuit 20-3.

Other structure of the second embodiment are similar to the first embodiment, and the description thereof will be omitted. It should be noted that the specific structure of each of the sub WL selecting circuits 20-0 to 20-3 is not limited to the above-mentioned structure shown in FIG. 7, and other forms may be used.

A description will now be given of an operation of the semiconductor memory device of the second embodiment.

In the second embodiment, the data reading and writing operations are performed for two consecutive memory cell blocks. That is, the data writing operation for one of the memory cells provided in the memory cell block #0 is performed during a cycle for performing the data reading operation for one of the memory cells provided in the memory cell block #1; the data writing operation for one of the memory cells provided in the memory cell block #1 is performed during a cycle for performing the data reading operation for one of the memory cells provided in the memory cell block #2; the data writing operation for one of the memory cells provided in the memory cell block #2 is performed during a cycle for performing the data reading operation for one of the memory cells provided in the memory cell block #3; the data writing operation for one of the memory cells provided in the memory cell block #3 is performed during a cycle for performing the data reading operation for one of the memory cells provided in the memory cell block #0.

In the second embodiment, the write block selection signal and the read block selection signal in the above-mentioned first embodiment are not needed to be generated, and instead, one selection signal is used and sent to each of the write block selecting circuits and the read block selecting circuits via the signal lines Y0 to Y3 so as to select the memory cell blocks to be written and read.

In the second embodiment, for example, the data writing operation is performed for the memory cell MC#F while the data reading operation for the memory cell MC#0 is performed; in the following cycle, the data writing operation is performed for the memory cell MC#0 while the data reading operation for the memory cell MC#1 is performed; in the following cycle, the data writing operation is performed for the memory cell MC#1 while the data reading operation for the memory cell MC#2 is performed. The operation for the two consecutive memory cells on the same row is the same as that of the first embodiment, and description thereof will be omitted.

A description will now be given of a case in which the data writing operation is performed for the memory cell MC#3 while the data reading operation for the memory cell MC#4 is performed.

The row selecting circuit 2 selects and activates the word line WL1. As mentioned above, the word line WL1 is connected to the other input of the second AND circuit of the sub WL selecting circuit 20-1, and also connected to the other input of the first AND circuit of the sub WL selecting circuit 20-0. When the word line WL1 is activated, a selection signal is supplied to the sub WL selecting circuits 14-0-1, 14-1-1, 14-2-1, 20-1 and 20-0. At the same time, the block selection signal is supplied to sub WL selecting circuits 14-0-0 to 14-0-3 via the block selection signal line BS0, and thus only the sub WL selecting circuit 14-0-1 is activated so as to send a signal to the sub word line SWL0-1. Additionally, a selection signal is sent from the column selecting circuit 21 via the signal line Y0. Accordingly, the read block selecting circuit 12-0 provided to the memory cell block #0 and the write block selecting circuit 11-3 provided to the memory cell block #3 are in the active state. Further, since the signal line Y0 is connected to the one input of each of the sub WL selecting circuits 20-0 to 20-3, and since the sub word selecting circuit 20-0 is supplied the signal via the word line WL1, the sub WL selecting circuit 20-0 is also activated so as to send a signal to the sub word line SWL3-0.

Although the signal is also supplied to the sub WL selecting circuits 20-1 to 20-3 via the signal line Y0, these sub WL selecting circuits are not activated because the word lines WL0, WL2 and WL3 are not in the active state. It should be noted that although the sub WL selecting circuit 20-1 is supplied the signal via the activated word line WL1, the signal is supplied to the second AND circuit, and there is no signal supplied to the other input of the second AND circuit. Accordingly, no signal is sent to the sub word line SWL3-1 from the sub WL selecting circuit 20-1.

According to the above-mentioned operation, data stored in the memory cell MC#4 connected to the sub word line SWL0-1 is sent to the data outputting circuit 6 via the bit lines 10 and the read block selecting circuit 12-0. At the same time, data supplied by an external device is supplied and stored to the memory cell MC#3 connected to the sub word line SWL3-0 via the write block selecting circuit 11-3 and the bit lines 10.

A description will now be given of a case in which the data writing operation is performed for the memory cell MC#F provided in the memory cell block #0 while the data reading operation for the memory cell MC#0 provided in the memory cell block #0 is performed.

The row selecting circuit 2 selects and activates the word line WL0. As mentioned above, the word line WL0 is connected to the other input of the second AND circuit of the sub WL selecting circuit 20-0, and also connected to the other input of the first AND circuit of the sub WL selecting circuit 20-3. When the word line WL0 is activated, a selection signal is supplied to the sub WL selecting circuits 14-0-0, 14-1-0, 14-2-0, 20-0 and 20-3. At the same time, the block selection signal is supplied to sub WL selecting circuits 14-0-0 to 14-0-3 via the block selection signal line BS0, and thus only the sub WL selecting circuit 14-0-0 is activated so as to send a signal to the sub word line SWL0-0. Additionally, a selection signal is sent from the column selecting circuit 21 via the signal line Y0. Accordingly, the read block selecting circuit 12-0 provided to the memory cell block #0 and the write block selecting circuit 11-3 provided to the memory cell block #3 are in the active state. Further, since the signal line Y0 is connected to the one input of each of the sub WL selecting circuits 20-0 to 20-3, and since the sub word selecting circuit 20-3 is supplied the signal via the word line WL0, the sub WL selecting circuit 20-3 is also activated so as to send a signal to the sub word line SWL3-3.

Although the signal is also supplied to the sub WL selecting circuits 20-0 to 20-2 via the signal line Y0, these sub WL selecting circuits are not activated because the word lines WL1, WL2 and WL3 are not in the active state. It should be noted that although the sub WL selecting circuit 20-0 is supplied the signal via the activated word line WL0, the signal is supplied to the second AND circuit, and there is no signal supplied to the other input of the second AND circuit. Accordingly, no signal is sent to the sub word line SWL3-0 from the sub WL selecting circuit 20-0.

According to the above-mentioned operation, data stored in the memory cell MC#0 connected to the sub word line SWL0-0 is sent to the data outputting circuit 6 via the bit lines 10 and the read block selecting circuit 12-0. At the same time, data supplied by an external device is supplied and stored to the memory cell MC#F connected to the sub word line SWL3-3 via the write block selecting circuit 11-3 and the bit lines 10.

As mentioned above, in the semiconductor memory device of the second embodiment, by fixing an order of data reading and writing operations, the write block selection signal and the read block selection signal in the above-mentioned first embodiment are not needed to be generated, and instead, one selection signal is used and sent to each of the write block selecting circuits and the read block selecting circuits via the signal lines Y0 to Y3 so as to select the memory cell blocks to be written and read. Therefore, a construction of the column selecting circuit 21 of the second embodiment can be simplified.

It should be noted that although the data reading operation is performed for the memory cell having a greater matrix coordinate value in the above description, the data reading operation may be performed for the memory cell having a lower number and the data writing operation may be performed for the memory cell having a greater matrix coordinate value.

Figure 7:
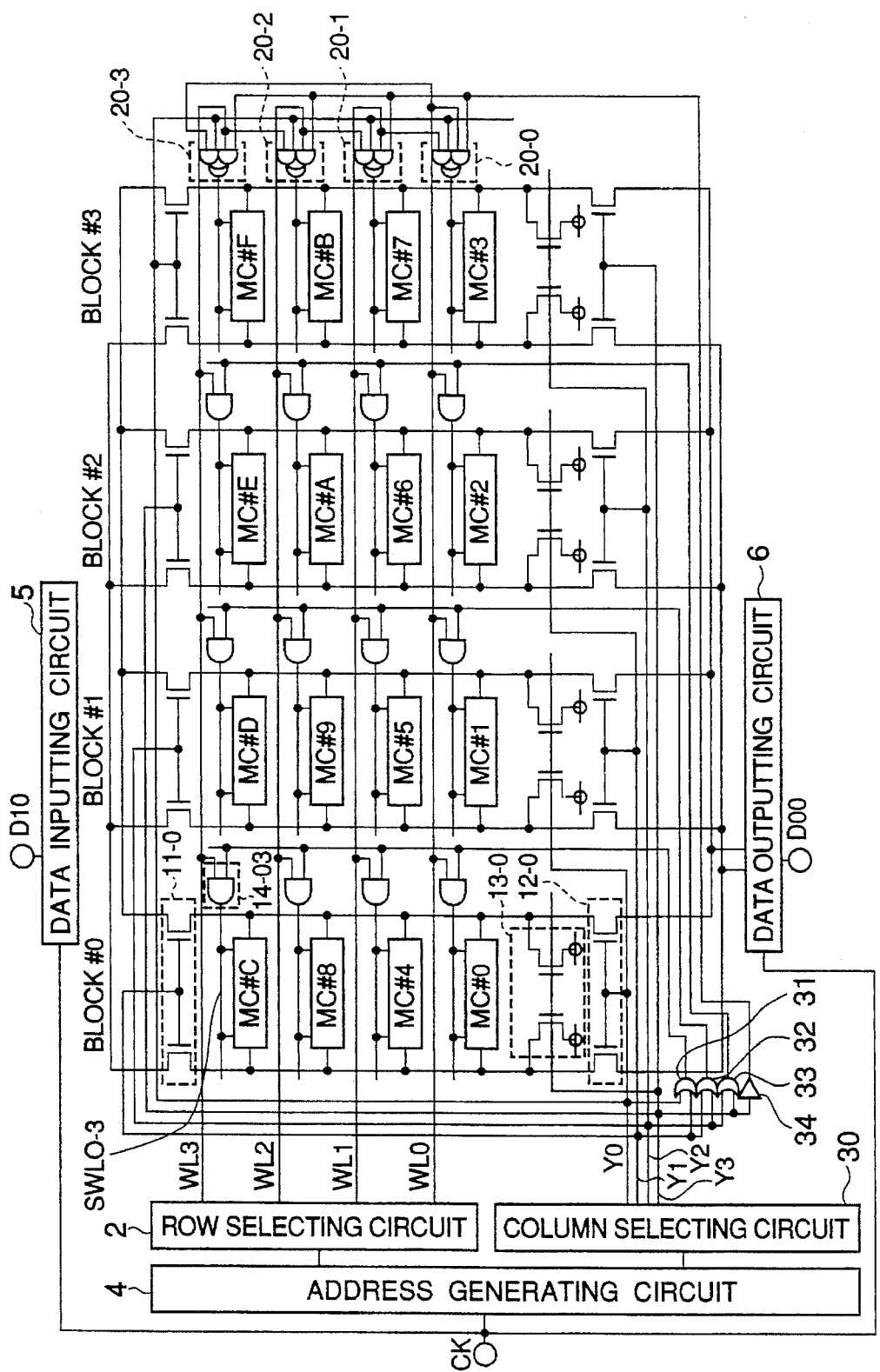
FIG. 7 is a third embodiment of a semiconductor memory device according to the present invention.

A description will now be given, with reference to FIG. 7, of a third embodiment of a semiconductor memory device according to the present invention. FIG. 7 shows a structure of the third embodiment of a semiconductor memory device according to the present invention. In FIG. 7, the parts the same as the parts shown in FIG. 6 are given the same reference numerals, and descriptions thereof will be omitted. In FIG. 7, the read block selecting circuits 12-0 to 12-3, the write block selecting circuits 11-0 to 11-3, the precharging circuits 13-0 to 13-3 the sub WL selecting circuits 14-0-0 to 14-2-3, and the sub WL selecting circuits 20-0 to 20-3 shown in FIGS. 4 or 6 are indicated by specific elements or gates. The third embodiment differs from the above-mentioned second embodiment in the connection of the signal lines extending from the output of a column selecting circuit 30.

In the above-mentioned second embodiment, the block selection signal is generated in the column selecting circuit 21, however in the third embodiment the block selection signal is generated by OR circuits 31, 32 and 33 and an inverter 34 connected to the signal lines Y0 to Y3 as shown in FIG. 7.

Two inputs of the OR circuit 31 are connected to the signal lines Y0 and Y1, respectively, and an output of the OR circuit 31 is connected to the sub WL selecting circuits 14-0-0 to 14-0-3 provided in the memory cell block #0. Two inputs of the OR circuit 32 are connected to the signal lines Y1 and Y2, respectively, and an output of the OR circuit 32 is connected to the sub WL selecting circuits 14-1-0 to 14-1-3 provided in the memory cell block #1. Two inputs of the OR circuit 33 are connected to the signal lines Y2 and Y3, respectively, and an output of the OR circuit 33 is connected to the sub WL selecting circuits 14-2-0 to 14-2-3 provided in the memory cell block #2. An input of the inverter 34 is connected to the signal line Y3, and the an output of the inverter 34 is connected to the sub WL selecting circuits 20-0 to 20-3 provided in the memory cell column #3.

In the above-mentioned structure, the block selection signal is generated by operations of the OR circuits 31, 32 and 33 and the inverter 34. Other operations in data reading and writing operations of the third embodiment are similar to that of the second embodiment, and description thereof will be omitted.

Figure 9A:
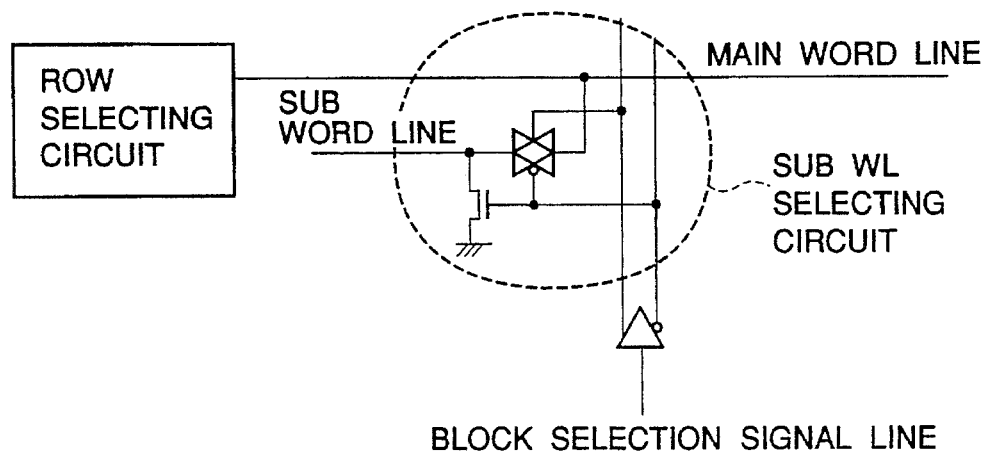
FIG. 9A is a circuit diagram of an example of the sub WL selecting circuit provided in the memory cell blocks #0 to #2 shown in FIG. 6.
Figure 9B:
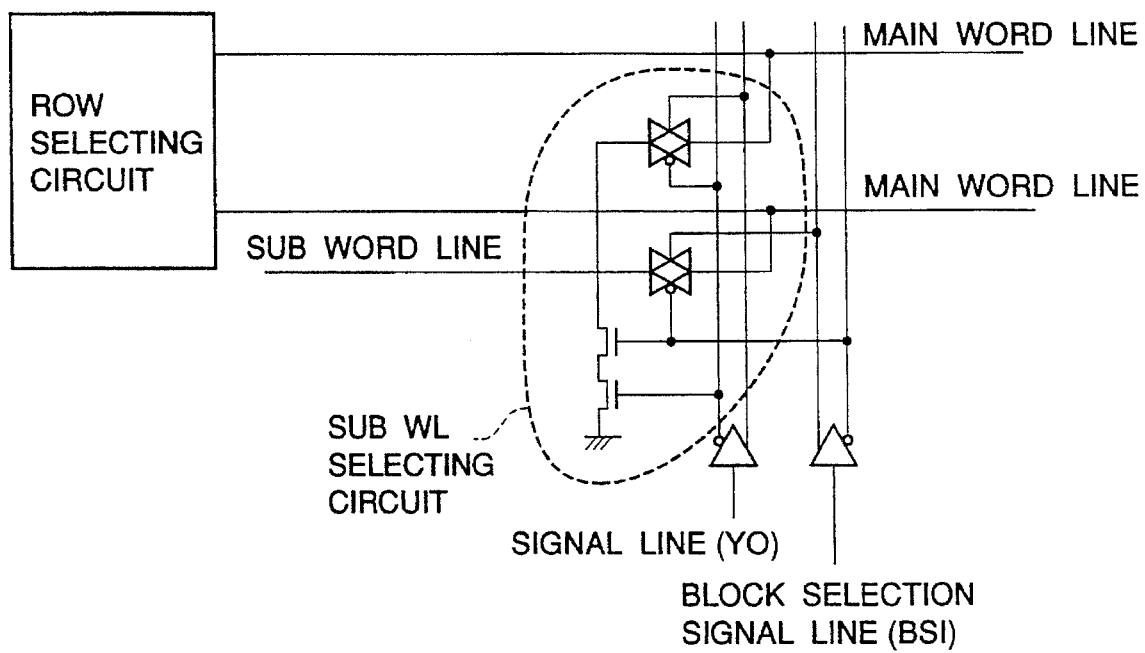
FIG. 9B is a circuit diagram of an example of the sub WL selecting circuit provided in the memory cell block #3 shown in FIG. 6.

A specific circuit structure of each of the sub WL selecting circuits provided in the memory cell blocks #0 to #2 of the second and third embodiments are shown in FIG. 9A. Another circuit structure of the sub WL selecting circuits provided in the memory cell block #3 is shown in FIG. 9B.

Figure 10:
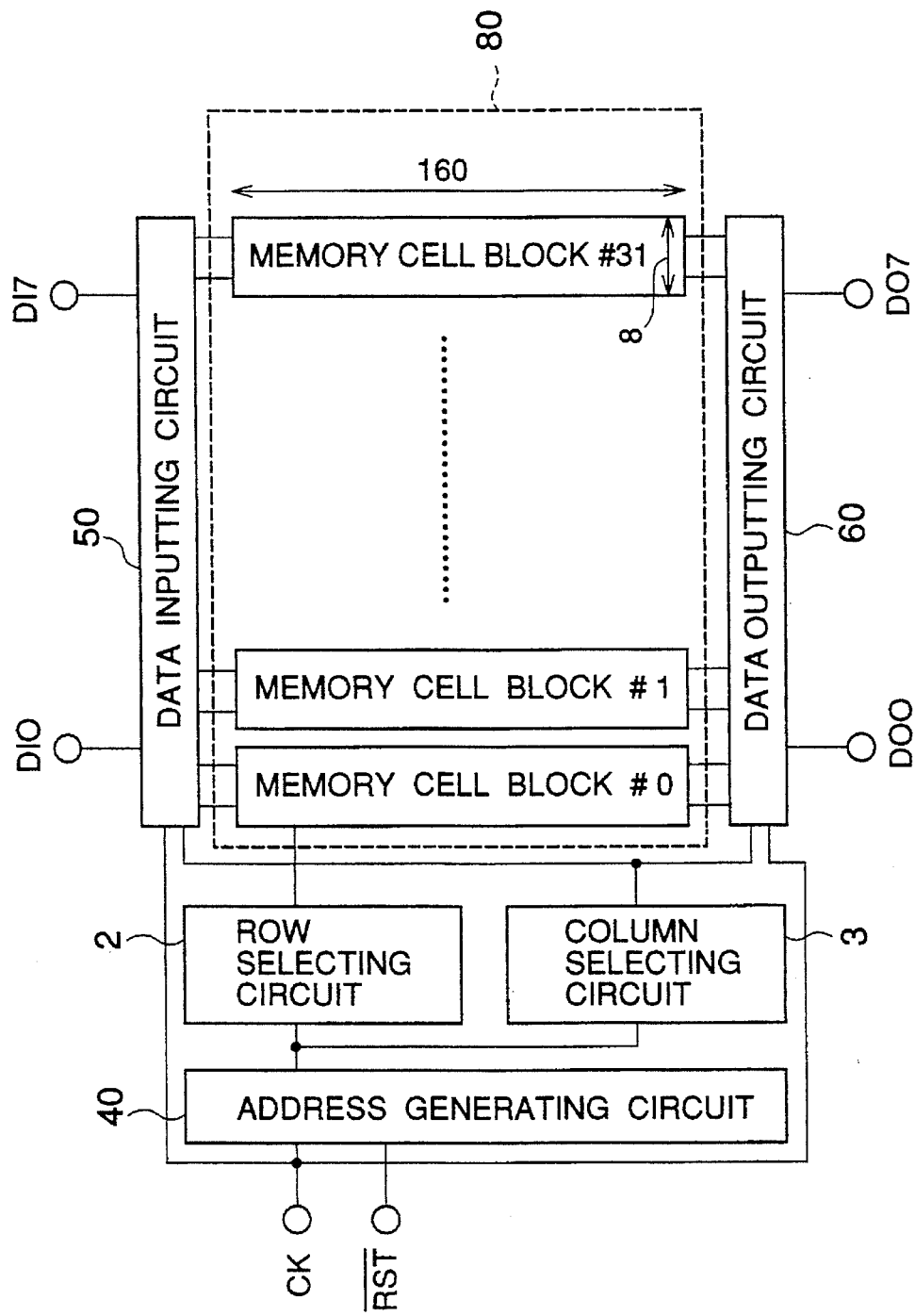
FIG. 10 is a block diagram of a semiconductor memory device according to the present invention which semiconductor device is applied to a line buffer.

FIG. 10 is a block diagram of a semiconductor memory device applied to a line buffer. The line buffer shown in FIG. 10 has memory cells for storing 5,120 words, each word comprising 8 bits. The memory cells are divided into 32 cell blocks from #0 to #31 each block having 160 memory cells.

FIG. 11 shows a semiconductor memory device in which each memory cell comprises 4 bits. The cells are arranged 4×4 matrix.

The line buffer shown in FIG. 10 can be formed referring to the semiconductor device shown in FIG. 11 by changing the bit number of the memory cell from 4 to 8, changing the number of rows from 4 to 160, and changing the number of columns from 4 to 32. In the line buffer shown in FIG. 10, other structures are the same as that of the semiconductor memory device shown in FIG. 3, and parts that are the same as the parts shown in FIG. 3 are given the same reference numerals.

A description will now be given of an operation of the line buffer shown in FIG. 10.

The line buffer shown in FIG. 10 performs data reading and writing operation, similarly to the above-mentioned second and third embodiments, in synchronization with a clock signal supplied to the address generating circuit 40, and thus the following description is focused on an entire operation of the line buffer.

Figure 12:
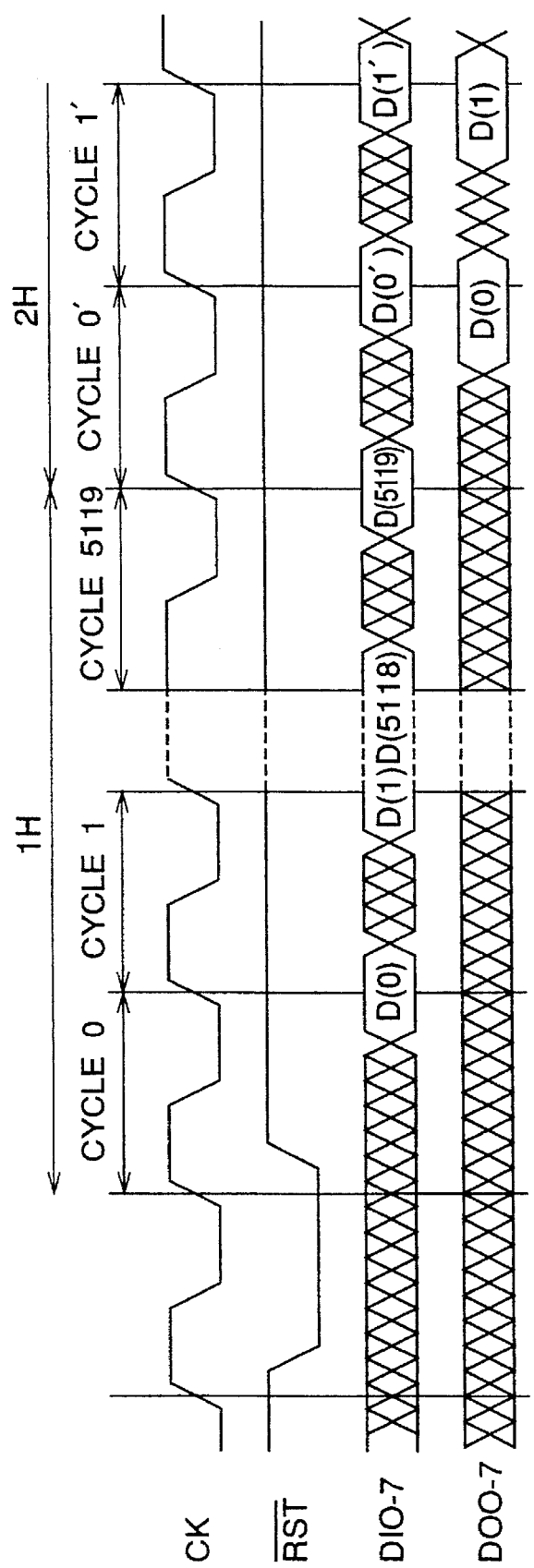
FIG. 12 is a timing chart of an operation performed by the line buffer shown in FIG. 10.

It is assumed that 5,120 pixels are included in a single scan line (1H), and an operation is started from a state in which no data is stored in all memory cells. The first pixel data D(0) comprising 8 bits is stored in the memory cell provided in the first row of the memory cell block #1 during the cycle 0 as shown in FIG. 12. This operation is repeated until the pixel data D(5119) is stored in the memory cell provided in the 160th row of the memory cell block #31. After the data writing operation for the pixel data D(5119) has been completed, the address generating circuit 40 is reset to generate address "0".

In the cycle 0' following the cycle 5119, the first pixel data D(0') of the next scan line is stored in the memory cell provided in the first row of the memory cell block #0, and the pixel data D(0) stored in the memory cell provided in the first row of the memory cell block #0 is read out. These operations are repeated for each of the memory cells. Therefore, the line buffer shown in FIG. 11 outputs data corresponding to a single scan line by a delay corresponding to 1H, that is 5,120 cycles. Accordingly, the line buffer shown in FIG. 11 is a first-in first-out buffer memory, and also a delay buffer for a single scan line.

Figure 13:
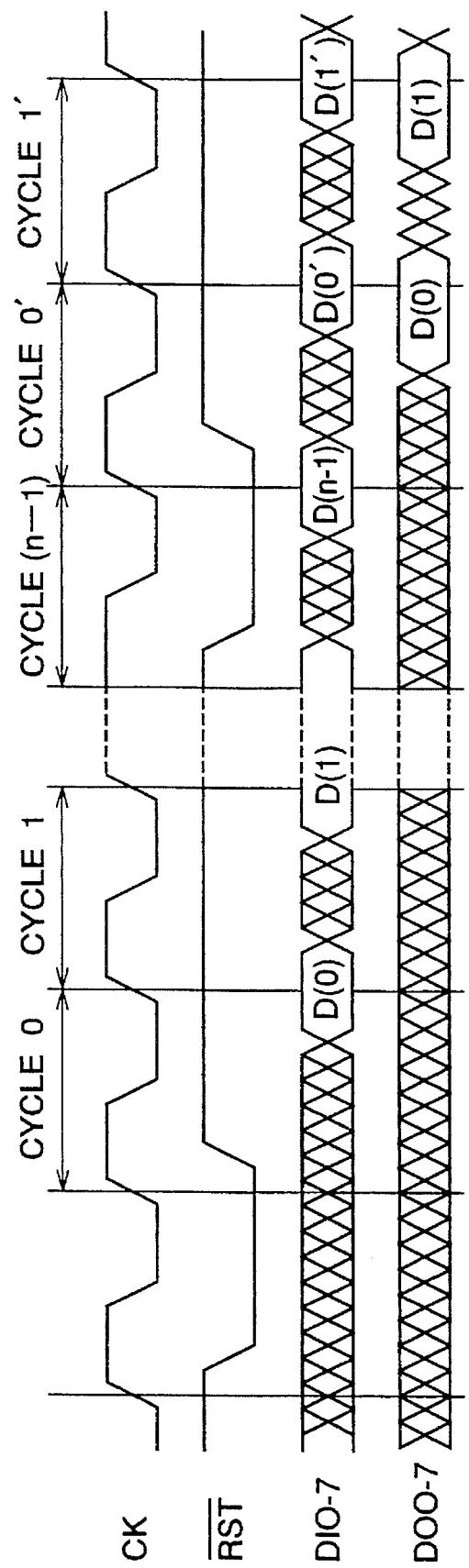
FIG. 13 is a timing chart of a variation of operation performed by the line buffer shown in FIG. 10.

Additionally, as shown in FIG. 13, by changing a timing for supplying the resent signal to the address generating circuit 40, the number of pixel data included in a single scan line can be changed to an arbitrary value, and thus a delay buffer for n bits can be obtained.

The present invention is not limited to the specifically disclosed embodiments, and variations and modifications may be made without departing from the scope of the present invention.

What is claimed is:

1. A semiconductor memory device having memory means comprising memory cells arranged in a matrix comprising n rows and m columns, where m≧2 and n≧1, each of the memory cells comprising a single port basic cell and being capable of storing a single word data comprising at least one bit, the memory cells arranged in a single column forming a memory cell block, the semiconductor memory device comprising:

selecting means for selecting one set of two cells having consecutive matrix coordinate values (s, t) and (s, t+1), respectively, where $1 \leq s \leq n$ and $1 \leq t \leq m$, and wherein s+1=1 when s=n, s−1=n when s=1, t+1=1 when t=m, and t−1=m when t=1, one of the two memory cells having a greater matrix coordinate value being a memory cell to be read;

reading means for reading the single word data stored in one of said two memory cells, the single word data of each of said memory cells being read out cycle by cycle;

writing means for writing the single word data in the other of said memory cells during a single cycle; and wherein a reading operation performed by said reading means and a writing operation performed by said writing means for said set of two memory cells are performed during the same cycle, another set of two memory cells having matrix coordinate values (s, t+1) and (s, t+2) being selected by said selecting means, when said reading operation and said writing operation for one cycle are completed, for performing another cycle of said reading operation and said writing operation, wherein s is incremented when t reaches m, said reading operation and said writing operation being repeated for a predetermined number of cycles by incrementing the matrix coordinate values of the two memory cells to be selected.

2. The semiconductor memory device as claimed in claim 1, wherein said writing means comprises write block selecting means, connected to each memory cell blocks, for selecting, in accordance with a selection signal, a memory cell block in which said the other of two memory cells to be written by said writing means is provided;

said reading means comprises read block selecting means, connected to each memory cell blocks, for selecting, in accordance with said selection signal, a memory cell block in which said one of said two memory cells to be read by said reading means is provided; and said selecting means comprises row selecting means for selecting a row on which the memory cell to be read is located, and column selecting means for selecting two memory cell blocks in which the memory cells to be read and to be written are provided, respectively, said selecting means further comprising means for sending said selection signal to the write block selecting means corresponding to the memory cell block in which the memory cell to be written is provided, and to the read block selecting means corresponding to the memory cell block in which the memory cell to be read is provided.

3. The semiconductor memory device as claimed in claim 2, comprising a pair of bit lines provided for each memory cell block, and precharging means for precharging one of said pair of bit lines corresponding to a memory cell block in which the memory cell having a matrix coordinate value next to that of the memory cell currently being read is provided.

4. The semiconductor memory device as claimed in claim 3, wherein said precharging means is activated by said selection signal output from said column selecting means.

5. The semiconductor memory device as claimed in claim 4, wherein said row selecting means comprises word lines provided to each row of the matrix, a row selection signal being sent from said row selecting means to one of said word lines corresponding to the row on which the memory cells to be read is located; and said selecting means further comprises:

sub word line selecting means, provided to each of the memory cells, for activating a sub word line connecting said sub word line selecting means to the corresponding memory cell so that said corresponding memory cell is activated, said sub word selecting means activating said sub word line when the row selection signal and the block selection signal are supplied thereto at the same time.

6. The semiconductor memory device as claimed in claim 5, wherein each of said word lines other than that provided to the first row is further connected to the sub word line selecting means corresponding to a memory cell having a nearest smaller matrix coordinate value provided in the memory cell block corresponding to the mth column of the matrix, and the word line provided to the first row is further connected to the memory cell having the greatest matrix coordinate value provided in the memory cell block corresponding to the mth column of the matrix.

7. The semiconductor memory device as claimed in claim 6, wherein the sub word line selecting means corresponding to each of the memory cells provided in each of the memory cell blocks are connected to said column selecting means via a respective block signal line, and a signal line provided for sending said selection signal to the write block selecting means provided to the memory cell block corresponding to the mth column is further connected to the sub word line selecting means corresponding to each of the memory cells provided in the memory cell block corresponding to the mth column, and wherein said sub word line selecting means activates corresponding sub word line either when the row selection signal and the block selection signal are supplied thereto at the same time or when the row selection signal and the selection signal are supplied at the same time.

8. The semiconductor memory device as claimed in claim 7, further comprising:

address generating means, connected to said row selecting means and said column selecting means, for generating address data corresponding to the matrix coordinate values to be supplied to said row selecting means and said column selecting means in accordance with a synchronous signal supplied by an external device;

data outputting means, connected to each of said read block selecting means, for outputting the data read out from the memory cells; and data inputting means, connected to write block selecting means, for inputting the data to be written in the memory cells from an external device.

9. The semiconductor memory device as claimed in claim 1, wherein said writing means comprises write block selecting means, connected to each memory cell blocks, for selecting, in accordance with a selection signal, a memory cell block in which said the other of two memory cells to be written by said writing means is provided;

said reading means comprises read block selecting means, connected to each memory cell block, for selecting, in accordance with said selection signal, a memory cell block in which said one of said two memory cells to be read by said reading means is provided;

said selecting means comprises row selecting means for selecting a row on which the memory cell to be read is located, means for sending said selection signal to the write block selecting means corresponding to a memory cell block in which the memory cell to be written is provided, and to the read block selecting means corresponding to a memory cell block in which the memory cell to be read is provided.

10. The semiconductor memory device as claimed in claim 9, wherein said row selecting means comprises word lines provided to each row of the matrix, a row selection signal being sent from said row selecting means to one of said word lines corresponding to the row on which the memory cells to be read is located;

said selecting means further comprises sub word line selecting means, provided to each of the memory cells, for activating a sub word line connecting said sub word line selecting means to the corresponding memory cell so that said corresponding memory cell is activated, said sub word selecting means activating said sub word line when the row selection signal and the selection signal are supplied thereto at the same time;

wherein the selection signal is supplied to each of the sub word line selecting means corresponding to the memory cells provided in two memory cell blocks in which the memory cells to be written and to be read are provided.

11. The semiconductor memory device as claimed in claim 10, comprising a pair of bit lines provided for each memory cell block, and precharging means for precharging one of said pair of bit lines corresponding to a memory cell block in which the memory cell having a matrix coordinate value next to that of the memory cell currently being read is provided.

12. The semiconductor memory device as claimed in claim 11, wherein each of said word line other than that provided to the first row is further connected to the sub word line selecting means corresponding to a memory cell having a nearest smaller matrix coordinate value provided in the memory cell block corresponding to the mth column of the matrix, and the word line provided to the first row is further connected to the memory cell having the greatest matrix coordinate value provided in the memory cell block corresponding to the mth column of the matrix.

13. The semiconductor memory device as claimed in claim 10, wherein said precharging means is activated by said selection signal output from said column selecting means.

14. The semiconductor memory device as claimed in claim 13, wherein the sub word line selecting means corresponding to each of the memory cells provided in each of the memory cell blocks is connected to said column selecting means via a respective block signal line, and a signal line provided for sending said selection signal to the write block selecting means provided to the memory cell block corresponding to the mth column is further connected to the sub word line selecting means corresponding to each of the memory cells provided in the memory cell block corresponding to the mth column, and wherein said sub word line selecting means activates corresponding sub word line either when the row selection signal and the block selection signal are supplied thereto at the same time or when the row selection signal and the selection signal are supplied at the same time.

15. A data writing and reading method for a semiconductor memory device having memory means comprising memory cells arranged in a matrix comprising n rows and m columns, where $m \geq 2$ and $n \geq 1$, each of said memory cells comprising a single port basic cell and being capable of storing a single word of data comprising at least one bit, the data writing and reading method comprising the steps of:

a) selecting two consecutive memory cells having matrix coordinate values (s, t) and (s+1, t+1) in the matrix, where $1 \leq s \leq n$ and $1 \leq t \leq m$, and wherein s+1=when s=n, s−1=n when s=1, t+1=when t=m, and t−1=m when t=1, b) reading the single word data stored in one of said two memory cells, the single word data of each of said memory cells being read out cycle by cycle;

c) writing the single word data in the other of said memory cells during a single cycle, a reading operation performed in the step b) and a writing operation in the step c) are performed during the same cycle;

d) selecting another set of two memory cells having matrix coordinate values (s, t+1) and (s, t+2), when the reading operation and the writing operation for one cycle are completed, for performing another cycle of the reading operation and the writing operation, wherein s is incremented when t reaches m, e) repeating the steps b) to d) for a predetermined number of cycles by incrementing the matrix coordinate values of the two memory cells to be selected.

16. The data writing and reading method as claimed in claim 15, wherein the writing operation is performed for a memory cell provided in a memory cell block corresponding to the (c−1)th column; the reading operation is performed for a memory cell provided in a memory cell block corresponding to the (c)th column; a bit line provided to the memory cells provided in the memory cell block corresponding to the (c+1)th column is precharged for the reading operation to be performed; where $1 \leq c \leq m$, and (c−1)=m when c=1, and (c+1)=1 when c=m.

17. A semiconductor memory device having memory means comprising memory cells arranged in a matrix comprising n rows and m columns, where $m \geq 2$ and $n \geq 1$, each of the memory cells comprising a single port basic cell and being capable of storing a single word data comprising at least one bit, the memory cells arranged in a single column forming a memory cell block, the semiconductor memory device comprising:

selecting means for selecting one set of two memory cells, one from an arbitrary memory cell block and the other from a different memory cell block, said selecting means including row selecting means for selecting a row on which said two memory cells are located, and column selecting means for selecting at least one memory cell block in which the memory cells to be read and to be written are provided;

reading means for reading the single word data stored in one of said two memory cells, the single word data of each of the memory cells being read out cycle by cycle, said reading means having read block selecting means connected to each memory cell blocks for selecting in accordance with a read block selection signal a memory cell block in which said one of said two memory cells to be read by said reading means is provided;

writing means for writing the single word data in the other of the memory cells during a single cycle, said writing means having write block selecting means connected to each memory cell blocks for selecting in accordance with a write block selection signal a memory cell block in which said the other of two memory cells to be written by said writing means is provided;

said selecting means further including means for sending said write block selection signal to the write block selecting means corresponding to a memory cell block in which said the other of said memory cells to be written is provided, and means for sending said read block selection signal to the read block selecting means corresponding to a memory cell block in which said one of said two memory cells to be read is provided; and wherein a reading operation performed by the reading means and a writing operation performed by the writing means for the set of two memory cells are performed during the same cycle;

another set of two memory cells being selected by said selecting means, when the reading operation and the writing operation for one cycle are completed, for performing another cycle of the reading operation and the writing operation, the reading operation and the writing operation being repeated for a predetermined number of cycles.

18. The semiconductor memory device as claimed in claim 17, further comprising precharging means for precharging a pair of bit lines provided for each memory cell block, said pair of bit lines being connected to each memory cell provided in a single memory cell block.

19. The semiconductor memory device as claimed in claim 18, wherein said set of two memory cells comprises memory cells having consecutive matrix coordinate values, the coordinate values being incremented by one for each cycle.

20. The semiconductor memory device as claimed in claim 19, wherein said precharging means precharges a pair of bit lines corresponding to the memory cell block in which a memory cell to be read in the next cycle is provided.

21. A semiconductor memory device having memory means comprising memory cells arranged in a matrix comprising n rows and m columns, where m≧2 and n≧1, each of the memory cells comprising a single port basic cell and being capable of storing a single word data comprising at least one bit, the memory cells arranged in a single column forming a memory cell block, the semiconductor memory device comprising:

selecting means for selecting one set of two memory cells, one from an arbitrary memory cell block and the other from a different memory cell block, said selecting means including word lines provided to each row of the matrix, a row selection signal being sent from row selecting means to one of said word lines corresponding to the row on which the memory cells to be read and to be written are located, and said selecting means further including sub word line selecting means, provided to each of the memory cells, for activating a sub word line connecting said sub word line selecting means to the corresponding memory cell so that said corresponding memory is activated, said sub word selecting means activating said sub word line when the row selection signal and a block selection signal are supplied thereto at the same time;

reading means for reading the single word data stored in one of said two memory cells, the single word data of each of the memory cells being read out cycle by cycle; and writing means for writing the single word data in the other of the memory cells during a single cycle;

wherein a reading operation performed by the reading means and a writing operation performed by the writing means for the set of two memory cells are performed during the same cycle, another set of two memory cells being selected by said selecting means, when the reading operation and the writing operation for one cycle are completed, for performing another cycle of the reading operation and the writing operation, the reading operation and the writing operation being repeated for a predetermined number of cycles.

22. The semiconductor memory device as claimed in claim 21, further comprising:

address generating means, connected to said row selecting means and column selecting means, for generating address data corresponding to the matrix coordinate values to be supplied to said row selecting means and said column selecting means in accordance with a synchronous signal supplied by an external device;

data outputting means, connected to each of read block selecting means, for outputting the data read out from the memory cells; and data inputting means, connected to write block selecting means, for inputting the data to be written in the memory cells from an external device.

* * * * *